(12) United States Patent
Shimada et al.

(10) Patent No.: US 8,442,153 B2
(45) Date of Patent: May 14, 2013

(54) TRANSMISSION CIRCUIT

(75) Inventors: Mikihiro Shimada, Osaka (JP); Kaoru Ishida, Kanagawa (JP); Hiroshi Komori, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/381,226

(22) PCT Filed: May 19, 2010

(86) PCT No.: PCT/JP2010/003366
§ 371 (c)(1),
(2), (4) Date: Dec. 28, 2011

(87) PCT Pub. No.: WO2011/001590
PCT Pub. Date: Jan. 6, 2011

(65) Prior Publication Data
US 2012/0114075 A1      May 10, 2012

(30) Foreign Application Priority Data

Jul. 2, 2009   (JP) ................................. 2009-158098

(51) Int. Cl.
*H04L 27/04* (2006.01)
(52) U.S. Cl.
USPC ........... 375/300; 375/136; 375/147; 375/268; 375/295
(58) Field of Classification Search .................. 375/298, 375/300, 136, 147, 268, 295; 332/108, 112, 332/115, 149; 455/91, 108, 116, 210
See application file for complete search history.

(56) References Cited

U.S. PATENT DOCUMENTS

| | | | |
|---|---|---|---|
| 8,019,293 B2 * | 9/2011 | Dagher et al. | 455/127.1 |
| 2004/0071225 A1 | 4/2004 | Suzuki et al. | |
| 2004/0185803 A1 | 9/2004 | Tanabe et al. | |
| 2007/0291873 A1 * | 12/2007 | Saito et al. | 375/298 |
| 2008/0054873 A1 | 3/2008 | Inoue | |

FOREIGN PATENT DOCUMENTS

| | | |
|---|---|---|
| JP | 2003-304127 | 10/2003 |
| JP | 2004-104194 | 4/2004 |
| JP | 2004-289812 | 10/2004 |
| JP | 2005-168230 | 6/2005 |
| JP | 2008-61452 | 3/2008 |

OTHER PUBLICATIONS

International Search Report issued Jun. 15, 2010 in corresponding International Application No. PCT/JP2010/003366.

\* cited by examiner

*Primary Examiner* — Dhaval Patel
(74) *Attorney, Agent, or Firm* — Wenderoth, Lind & Ponack, L.L.P.

(57) ABSTRACT

A transmission circuit (100) according to the present invention includes an RF-IC (110), an EM-IC (120), and a power amplifier (130). The EM-IC (120) includes a DC-DC converter (123), a transistor (124), a low-dropout regulator (121), and a regulator output selector switch (122). After an elapse of a predetermined time from a time when an operation mode of the transmission circuit has switched from a polar modulation mode to a quadrature modulation mode to a time when a power supply voltage for the quadrature modulation mode output from the DC-DC converter (123) stabilizes at a desired value, the regulator output selector switch (122) switches a connection destination of a gate of the transistor (124) to a fixed potential, and outputs as a control voltage the power supply voltage for the quadrature modulation mode output from the DC-DC converter (123).

8 Claims, 10 Drawing Sheets

TRANSMISSION CIRCUIT

TECHNICAL FIELD

The present invention relates to a transmission circuit that amplifies the power of an input transmission signal by quadrature modulation or polar modulation, and in particular, relates to a transmission circuit that controls a voltage that is to be supplied to a power amplifier, using a low-dropout regulator (hereinafter referred to as "LDO").

BACKGROUND ART

A communication apparatus such as a mobile phone or a wireless LAN is required to ensure the accuracy of a transmission signal, and also operate with a low power consumption. Such a communication apparatus uses a transmission circuit that is small in size, operates at a high efficiency, and outputs a transmission signal having a high linearity.

Examples of a conventional transmission circuit include a transmission circuit that generates a transmission signal using a modulation scheme such as quadrature modulation (hereinafter referred to as a "quadrature modulation circuit"). Further, a polar modulation circuit is known that is smaller than, and also operates at a higher efficiency than, the quadrature modulation circuit. Generally, polar modulation allows the use of a power amplifier, included in a transmission circuit, in a saturated state. This enables the power amplifier to output a desired power at a high efficiency. This makes it possible to reduce the power consumption of the transmission circuit as compared to the case where the transmission circuit operates by quadrature modulation.

In addition, polar modulation makes it possible to reduce the device size of the power amplifier as compared to the case of quadrature modulation. This makes it possible to set an increased efficiency of the power amplifier by switching the operation mode to that of quadrature modulation only at the time of a low output.

FIG. 9 is a diagram showing a conventional transmission circuit 900. In FIG. 9, the conventional transmission circuit 900 includes a radio frequency integrated circuit (hereinafter referred to as "RF-IC") 910, an envelope management integrated circuit (hereinafter referred to as "EM-IC") 920, and a power amplifier (PA) 930.

When the output of the conventional transmission circuit 900 is a high output, the conventional transmission circuit 900 operates in a polar modulation mode. In the polar modulation mode, a transmission signal input to the RF-IC 910 is separated into a phase component and an amplitude component. The amplitude component is converted into an amplitude-modulated signal, and the amplitude-modulated signal is input to the EM-IC 920. The EM-IC 920 generates a control voltage Vout on the basis of the input amplitude-modulated signal, and supplies the control voltage Vout to the power amplifier 930. The phase component is converted into a phase-modulated signal having a constant amplitude, and the phase-modulated signal is input to the power amplifier 930. The power amplifier 930 amplifies the power of the input phase-modulated signal on the basis of the control voltage Vout supplied from the EM-IC 920, and outputs the resulting phase-modulated signal as a transmission signal.

On the other hand, when the output of the conventional transmission circuit 900 is a low output, the conventional transmission circuit 900 operates in a quadrature modulation mode. In the quadrature modulation mode, a transmission signal input to the RF-IC 910 is converted into a quadrature-modulated signal on an input path side, and the quadrature-modulated signal is input to the power amplifier 930. The EM-IC 920, which is on a power supply path side, generates the control voltage Vout on the basis of a power supply voltage, and supplies the control voltage Vout to the power amplifier 930. The power amplifier 930 amplifies the power of the input quadrature-modulated signal on the basis of the control voltage Vout supplied from the EM-IC 920, and outputs the resulting quadrature-modulated signal as a transmission signal.

As described above, in accordance with the operation mode of the conventional transmission circuit 900, the EM-IC 920 switches the control voltage Vout, which is to be supplied to the power amplifier 930, to that for the polar modulation mode or that for the quadrature modulation mode. Further, Patent Literature 1 discloses a power supply device that achieves a high efficiency by switching between an LDO and a switching regulator.

CITATION LIST

Patent Literature

[PTL 1] Japanese Laid-Open Patent Publication No. 2008-61452

SUMMARY OF THE INVENTION

Problems to be Solved by the Invention

In the conventional transmission circuit 900, however, when the operation mode switches from the polar modulation mode to the quadrature modulation mode, the EM-IC 920 cannot immediately supply the control voltage Vout stabilized at a desired value to the power amplifier 930.

FIG. 10 is a diagram showing the state where the operation mode of the conventional transmission circuit 900 switches from the polar modulation mode to the quadrature modulation mode. In FIG. 10, a period for data communication is divided into a plurality of time slots. Here, a description is given of the case where the operation mode of the conventional transmission circuit 900 switches from the polar modulation mode to the quadrature modulation mode at a time t1, which is the time when a slot S1 switches to a slot S2.

In the slot S1, the operation mode of the conventional transmission circuit 900 is the polar modulation mode. Thus, the EM-IC 920 generates the control voltage Vout on the basis of the input amplitude-modulated signal, and supplies the control voltage Vout to the power amplifier 930.

Next, at the time t1, the operation mode of the conventional transmission circuit 900 switches from the polar modulation mode to the quadrature modulation mode. Accordingly, the EM-IC 920 generates the control voltage Vout for the quadrature modulation mode on the basis of the power supply voltage, and supplies the control voltage Vout to the power amplifier 930. At the time t1, however, the EM-IC 920 cannot immediately supply the control voltage Vout having a desired value to the power amplifier 930. Thus, the control voltage Vout continues to change until a time t3, and finally stabilizes at the desired value at the time t3.

Here, 3GPP (Third Generation Partnership Project), which is the standard governing organization for disseminating the W-CDMA (Wideband Code Division Multiple Access) standard, requires power control to be limited in ±25 µsec from a symbol boundary. That is, power control is required to stabilize in a slot boundary (±25 µsec) at the switching of slots. Here, the EM-IC 920 is required to supply the control voltage Vout stabilized at the desired value to the power amplifier 930 by a time t2, which is +25 µsec from the time t1, which is the time when the slot S1 switches to the slot S2. As shown in FIG. 10, however, the control voltage Vout is not stabilized at the desired value at the time t2.

Therefore, it is an object of the present invention to provide a transmission circuit capable of, when the operation mode of the transmission circuit that amplifies the power of an input transmission signal switches from a polar modulation mode to a quadrature modulation mode, supplying to a power amplifier a control voltage stabilized at a desired value in a slot boundary.

Solution to the Problems

To achieve the above object, a transmission circuit according to the present invention is a transmission circuit that amplifies a power of an input transmission signal by switching an operation mode of the transmission circuit between a polar modulation mode and a quadrature modulation mode, the transmission circuit including: an RF-IC that controls the operation mode of the transmission circuit on the basis of the input transmission signal, generates an amplitude-modulated signal and a phase-modulated signal in the polar modulation mode, and generates a quadrature-modulated signal in the quadrature modulation mode; an EM-IC that generates a control voltage on the basis of the amplitude-modulated signal from the RF-IC or a power supply voltage; and a power amplifier that amplifies a power of the phase-modulated signal or the quadrature-modulated signal from the RF-IC on the basis of the control voltage from the EM-IC, the EM-IC including: a DC-DC converter that outputs the power supply voltage for the polar modulation mode or the quadrature modulation mode on the basis of the control of the operation mode by the RF-IC; a transistor whose source is connected to an output of the DC-DC converter and whose drain is connected to a power supply terminal of the power amplifier; a regulator having an input terminal to which the amplitude-modulated signal from the RF-IC is input, and a common terminal which is connected to the drain of the transistor and to which the power supply voltage for the polar modulation mode or the quadrature modulation mode from the DC-DC converter is input; and a regulator output selector switch that, on the basis of the control of the operation mode by the RF-IC, connects a gate of the transistor to an output terminal of the regulator while the operation mode of the transmission circuit is the polar modulation mode, and, when the operation mode of the transmission circuit has switched from the polar modulation mode to the quadrature modulation mode, switches a connection destination of the gate of the transistor to a fixed potential after an elapse of a predetermined time until the power supply voltage for the quadrature modulation mode output from the DC-DC converter stabilizes at a desired value.

It is preferable that the predetermined time should be set in advance.

Alternatively, it is preferable that the transmission circuit should further include a monitoring section that monitors the power supply voltage for the quadrature modulation mode output from the DC-DC converter, wherein the regulator output selector switch should switch the connection destination of the gate of the transistor to the fixed potential at a time when the power supply voltage for the quadrature modulation mode, which has been monitored by the monitoring section since the operation mode of the transmission circuit has switched from the polar modulation mode to the quadrature modulation mode, stabilizes at the desired value.

In addition, it is preferable that the regulator output selector switch should switch the connection destination of the gate of the transistor to the output terminal of the regulator simultaneously when the operation mode of the transmission circuit switches from the quadrature modulation mode to the polar modulation mode.

In addition, it is preferable that supply of power to the regulator should be stopped simultaneously when the connection destination of the gate of the transistor is switched to the fixed potential.

To achieve the above object, a communication apparatus according to the present invention includes: a transmission circuit that generates a transmission signal; and an antenna that outputs the transmission signal generated by the transmission circuit, wherein the transmission circuit is the transmission circuit described above.

In addition, it is preferable that the communication apparatus should further include: a reception circuit that processes a reception signal received from the antenna; and an antenna duplexer that outputs to the antenna the transmission signal generated by the transmission circuit, and outputs to the reception circuit the reception signal received from the antenna.

To achieve the above object, a method according to the present invention is a method of amplifying a power of an input transmission signal by switching an operation mode of a transmission circuit between a polar modulation mode and a quadrature modulation mode, the method including: a signal generation step of controlling the operation mode of the transmission circuit on the basis of the input transmission signal, generating an amplitude-modulated signal and a phase-modulated signal in the polar modulation mode, and generating a quadrature-modulated signal in the quadrature modulation mode; a control voltage generation step of generating a control voltage on the basis of the amplitude-modulated signal generated in the signal generation step or a power supply voltage; and a power amplification step of, on the basis of the control voltage generated in the control voltage generation step, amplifying a power of the phase-modulated signal or the quadrature-modulated signal generated in the signal generation step, the control voltage generation step including: a step of, immediately after the operation mode of the transmission circuit has switched from the polar modulation mode to the quadrature modulation mode, feeding back the power supply voltage for the quadrature modulation mode, output from a DC-DC converter, to a common terminal of a regulator while maintaining a connection destination of a gate of a transistor at an output terminal of the regulator, and outputting the control voltage based on the amplitude-modulated signal input to an input terminal of the regulator; and a step of, after an elapse of a predetermined time from a time when the operation mode of the transmission circuit has switched from the polar modulation mode to the quadrature modulation mode to a time when the power supply voltage for the quadrature modulation mode output from the DC-DC converter stabilizes at a desired value, switching the connection destination of the gate of the transistor to a fixed potential, and outputting as the control voltage the power supply voltage for the quadrature modulation mode output from the DC-DC converter.

Advantageous Effects of the Invention

As described above, based on the present invention, it is possible to achieve a transmission circuit capable of, when the operation mode of the transmission circuit that amplifies the power of an input transmission signal switches from a polar modulation mode to a quadrature modulation mode, supplying to a power amplifier a control voltage stabilized at a desired value even immediately after the operation mode of the transmission circuit has switched from the polar modulation mode to the quadrature modulation mode, by controlling the time for switching a regulator output selector switch in an EM-IC.

DESCRIPTION OF EMBODIMENTS

With reference to the drawings, descriptions are given below of embodiments of the present invention.

<First Embodiment>

Figure 1:
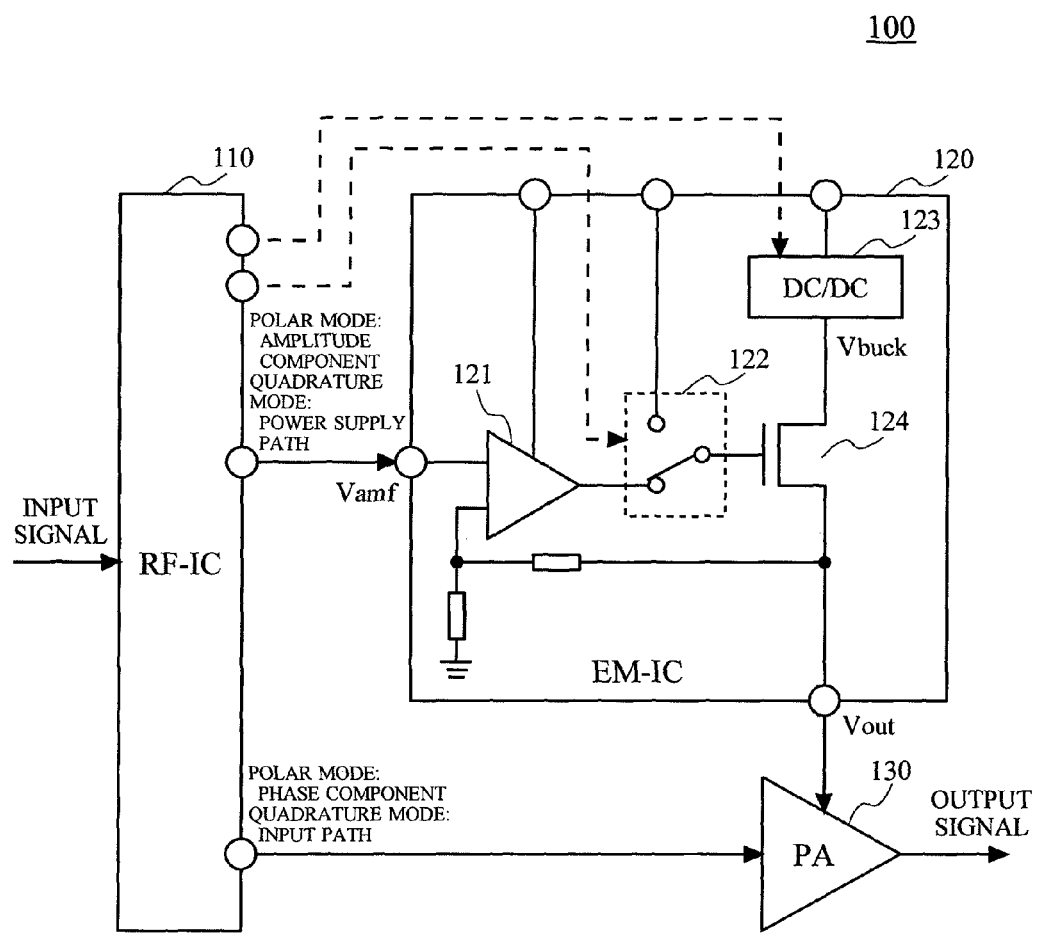
FIG. 1 is a diagram showing a transmission circuit 100 according to a first embodiment of the present invention.

FIG. 1 is a diagram showing a transmission circuit 100 according to a first embodiment of the present invention. In FIG. 1, the transmission circuit 100 according to the first embodiment of the present invention includes an RF-IC 110, an EM-IC 120, and a power amplifier (PA) 130. It should be noted that the EM-IC 120 includes an LDO 121, an LDO output selector switch 122, a DC-DC converter 123, and a transistor 124.

When the output of the transmission circuit 100 according to the first embodiment of the present invention is a high output, the transmission circuit 100 operates in a polar modulation mode. In the polar modulation mode, a transmission signal input to the RF-IC 110 is separated into a phase component and an amplitude component. The amplitude component is converted into an amplitude-modulated signal, and the amplitude-modulated signal is input to the EM-IC 120. The EM-IC 120 generates a control voltage Vout on the basis of the input amplitude-modulated signal, and supplies the control voltage Vout to the power amplifier 130. The phase component is converted into a phase-modulated signal having a constant amplitude, and the phase-modulated signal is input to the power amplifier 130. The power amplifier 130 amplifies the power of the input phase-modulated signal on the basis of the control voltage Vout supplied from the EM-IC 120, and outputs the resulting phase-modulated signal as a transmission signal.

On the other hand, when the output of the transmission circuit 100 according to the first embodiment of the present invention is a low output, the transmission circuit 100 operates in a quadrature modulation mode. In the quadrature modulation mode, a transmission signal input to the RF-IC 110 is converted into a quadrature-modulated signal on an input path side, and the quadrature-modulated signal is input to the power amplifier 130. The EM-IC 120, which is on a power supply path side, generates the control voltage Vout on the basis of a power supply voltage, and supplies the control voltage Vout to the power amplifier 130. The power amplifier 130 amplifies the power of the input quadrature-modulated signal on the basis of the control voltage Vout supplied from the EM-IC 120, and outputs the resulting quadrature-modulated signal as a transmission signal.

As described above, in polar modulation and quadrature modulation, the basic operations of the transmission circuit 100 according to the first embodiment of the present invention are similar to the operations of the conventional transmission circuit 900 described above. The transmission circuit 100 according to the first embodiment of the present invention is different from the conventional transmission circuit 900 in the operation of the EM-IC 120 when the operation mode of the transmission circuit 100 switches from the polar modulation mode to the quadrature modulation mode. The operation of the EM-IC 120 is described in detail below.

As shown in FIG. 1, the EM-IC 120 of the transmission circuit 100 according to the first embodiment of the present invention includes the LDO 121, the LDO output selector switch 122, the DC-DC converter 123, and the transistor 124. The EM-IC 120 supplies the control voltage Vout to a power supply terminal of the power amplifier 130. The source of the transistor 124 is connected to the DC-DC converter 123, and the drain of the transistor 124 is connected to the power supply terminal of the power amplifier 130. Further, the connecting point between the drain of the transistor 124 and the power supply terminal of the power amplifier 130 is also connected to a common terminal of the LDO 121. An output terminal of the LDO 121 is connected to the gate of the transistor 124 via the LDO output selector switch 122. It should be noted that, here, the transistor 124 is, but is not limited to, a field-effect transistor, and may be, for example, a bipolar transistor.

Figure 2A:
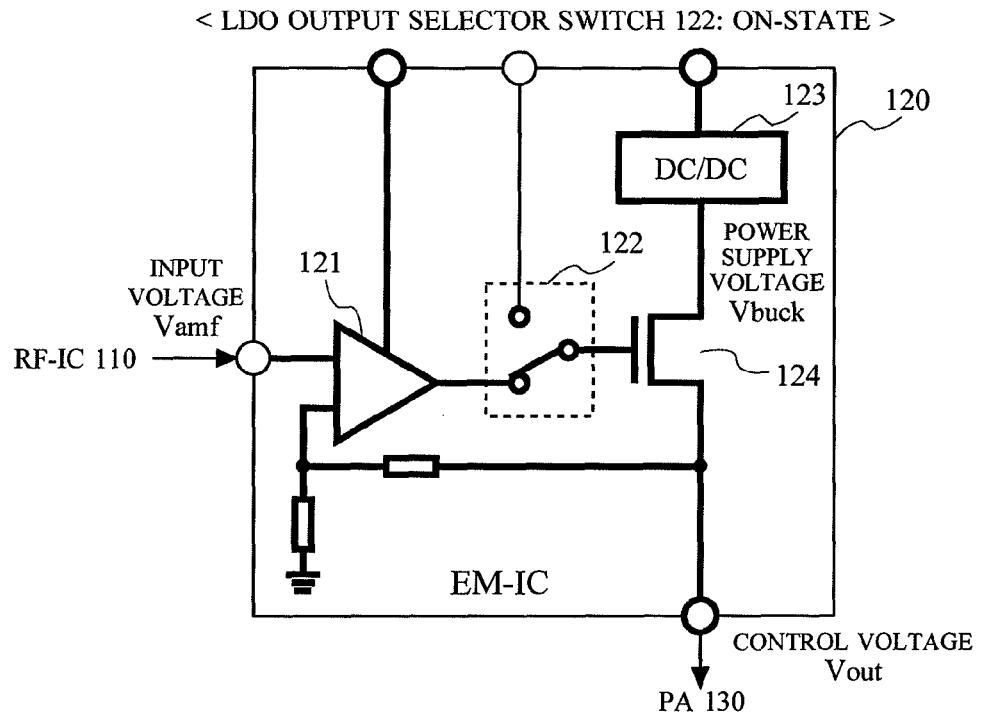
FIG. 2A is a diagram showing the state of an EM-IC 120 in the case where an LDO output selector switch 122 is in an on-state.

FIG. 2A is a diagram showing the state of the EM-IC 120 in the case where the LDO output selector switch 122 of the EM-IC 120 is in an on-state. Here, the LDO output selector switch 122 being in an on-state refers to the state where the connection destination of the gate of the transistor 124 is the output terminal of the LDO 121.

In FIG. 2A, in the case where the LDO output selector switch 122 is in the on-state, the output terminal of the LDO 121 is connected to the gate of the transistor 124 via the LDO output selector switch 122. Consequently, a power supply voltage Vbuck supplied from the DC-DC converter 123 to the source of the transistor 124 is fed back from the drain of the transistor 124 to the common terminal of the LDO 121. An input voltage Vamf input from the RF-IC 110 to an input terminal of the LDO 121 is output as the control voltage Vout to the power supply terminal of the power amplifier 130 via the LDO output selector switch 122 and the transistor 124. As described above, in the case where the LDO output selector switch 122 is in the on-state, the EM-IC 120 generates the control voltage Vout on the basis of the input voltage Vamf via the LDO 121, and supplies the control voltage Vout to the power amplifier 130.

Figure 2B:
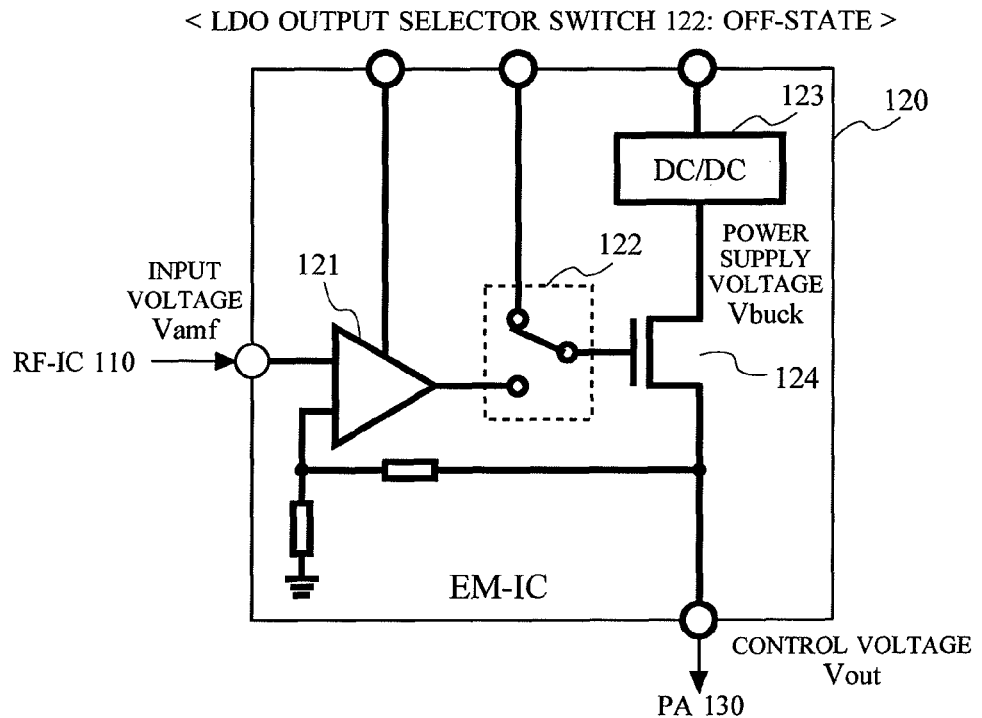
FIG. 2B is a diagram showing the state of the EM-IC 120 in the case where the LDO output selector switch 122 is in an off-state.

FIG. 2B is a diagram showing the state of the EM-IC 120 in the case where the LDO output selector switch 122 of the EM-IC 120 is in an off-state. Here, the LDO output selector switch 122 being in an off-state refers to the state where the connection destination of the gate of the transistor 124 is a fixed potential.

In FIG. 2B, in the case where the LDO output selector switch 122 is in the off-state, the output terminal of the LDO 121 is not connected to the gate of the transistor 124. Consequently, the power supply voltage Vbuck supplied from the DC-DC converter 123 to the source of the transistor 124 is output as it is as the control voltage Vout from the drain of the transistor 124 to the power supply terminal of the power amplifier 130. As described above, in the case where the LDO output selector switch 122 is in the off-state, the EM-IC 120 supplies the power supply voltage Vbuck, output from the DC-DC converter 123, as it is as the control voltage Vout to the power amplifier 130.

Figure 3:
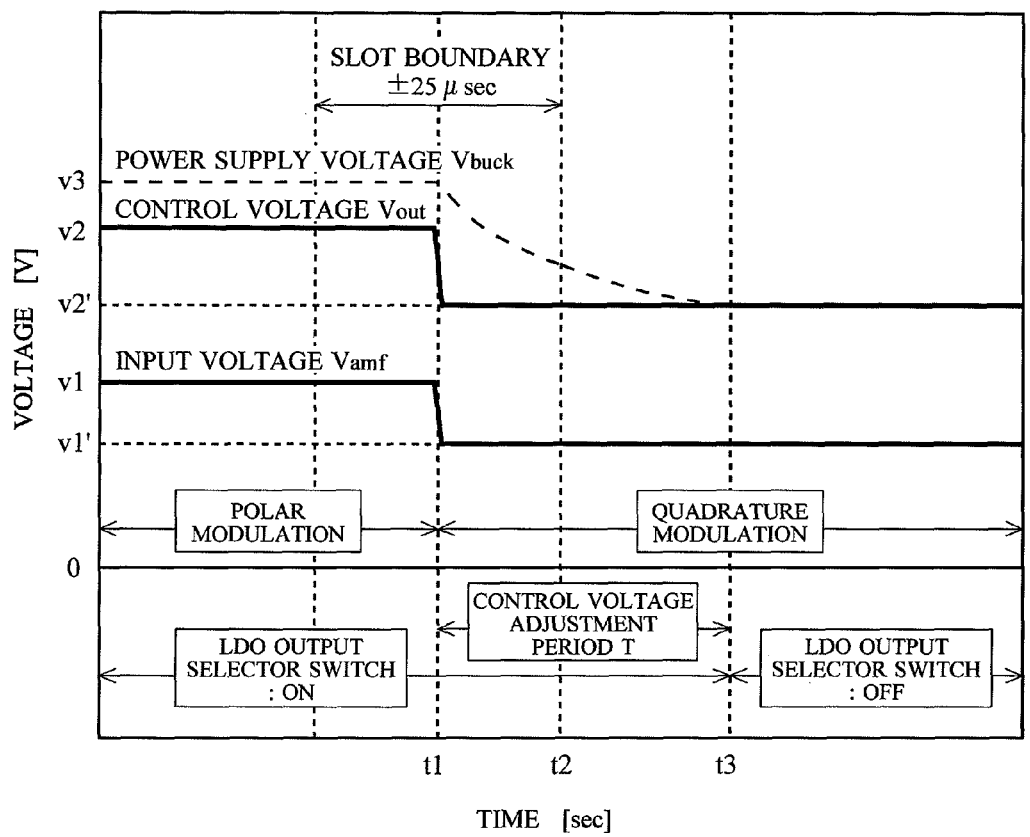
FIG. 3 is a diagram showing the operation of the EM-IC 120 in the case where the operation mode of the transmission circuit 100 according to the first embodiment of the present invention switches from a polar modulation mode to a quadrature modulation mode.

FIG. 3 is a diagram showing the operation of the EM-IC 120 in the case where the operation mode of the transmission circuit 100 according to the first embodiment of the present invention switches from the polar modulation mode to the quadrature modulation mode.

Until a time t1, the operation mode of the transmission circuit 100 according to the first embodiment of the present invention is the polar modulation mode. In this case, in the EM-IC 120, the LDO output selector switch 122 operates in the on-state as shown in FIG. 2A. The EM-IC 120 generates the control voltage Vout (=v2) on the basis of the input voltage Vamf (=v1) via the LDO 121, and supplies the control voltage Vout to the power amplifier 130. It should be noted that, here, the control voltage Vout (=v2) is twice the input voltage Vamf (=v1).

Next, at the time t1, the operation mode of the transmission circuit 100 according to the first embodiment of the present invention switches from the polar modulation mode to the quadrature modulation mode. Immediately after the time t1, on the basis of the control of the RF-IC 110, the DC-DC converter 123 of the EM-IC 120 controls the power supply voltage Vbuck, which is to be output, such that the power supply voltage Vbuck is a power supply voltage for the quadrature modulation mode. As shown in FIG. 3, however, the power supply voltage Vbuck stabilizes at a desired value (v2') at a time t3.

Here, in the transmission circuit 100 according to the first embodiment of the present invention, the LDO output selector switch 122 of the EM-IC 120 operates while remaining in the on-state during a control voltage adjustment period T: from the time t1 when the operation mode has switched from the polar modulation mode to the quadrature modulation mode; to the time t3 when the power supply voltage Vbuck stabilizes at the desired value (v2'). That is, during the control voltage adjustment period T, the EM-IC 120 generates the control voltage Vout (=v2') on the basis of the input voltage Vamf (=v1') via the LDO 121, and supplies the control voltage Vout to the power amplifier 130.

Next, at the time t3, the power supply voltage Vbuck output from the DC-DC converter 123 stabilizes at the desired value (v2'). Here, the LDO output selector switch 122 of the EM-IC 120 is switched to the off-state on the basis of the control of the RF-IC 110, and the LDO output selector switch 122 operates in the off-state as shown in FIG. 2B. This causes the EM-IC 120 to supply the power supply voltage Vbuck, output from the DC-DC converter 123, as it is as the control voltage Vout to the power amplifier 130.

Figure 4:
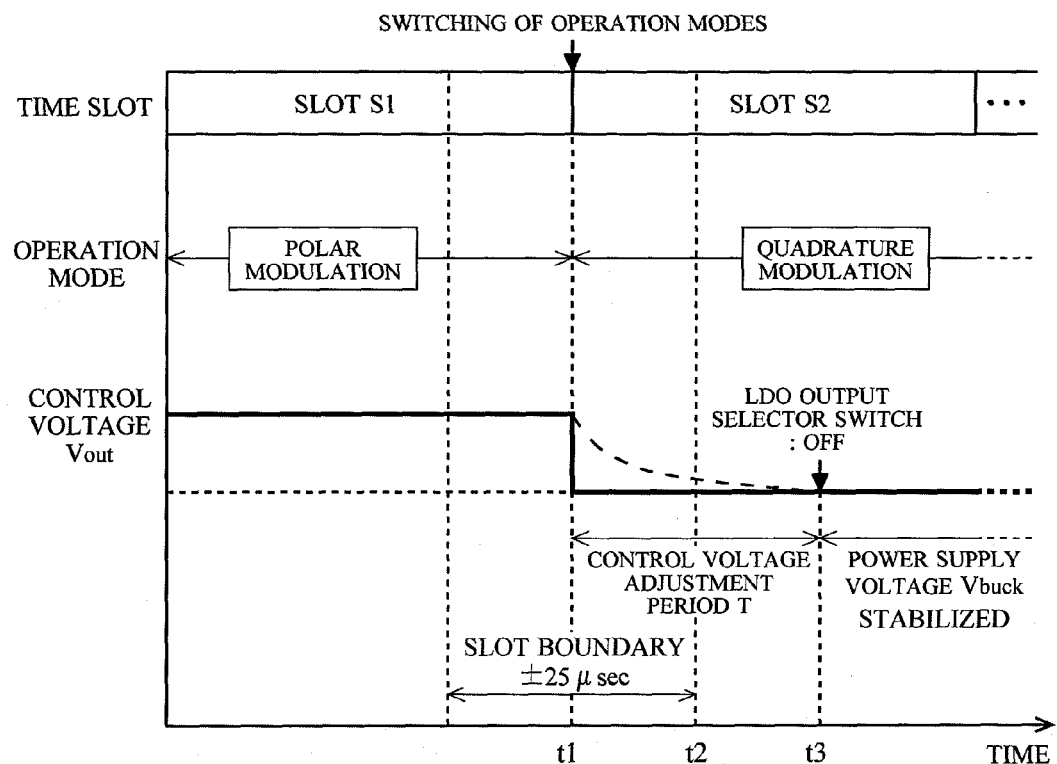
FIG. 4 is a diagram showing the state where the operation mode of the transmission circuit 100 according to the first embodiment of the present invention switches from the polar modulation mode to the quadrature modulation mode.

FIG. 4 is a diagram showing the state where the operation mode of the transmission circuit 100 according to the first embodiment of the present invention switches from the polar modulation mode to the quadrature modulation mode. In FIG. 4, a period for data communication is divided into a plurality of time slots. Here, a description is given of the case where the operation mode of the transmission circuit 100 according to the first embodiment of the present invention switches from the polar modulation mode to the quadrature modulation mode at the time t1, which is the time when a slot S1 switches to a slot S2.

In the slot S1, the operation mode of the transmission circuit 100 according to the first embodiment of the present invention is the polar modulation mode. Thus, the EM-IC 120 generates the control voltage Vout on the basis of the input amplitude-modulated signal via the LDO 121, and supplies the control voltage Vout to the power amplifier 130.

Next, at the time t1, the operation mode of the transmission circuit 100 according to the first embodiment of the present invention switches from the polar modulation mode to the quadrature modulation mode. In the EM-IC 120, the power supply voltage Vbuck output from the DC-DC converter 123 is controlled on the basis of the control of the RF-IC 110 so as to be the power supply voltage for the quadrature modulation mode.

Figure 10:
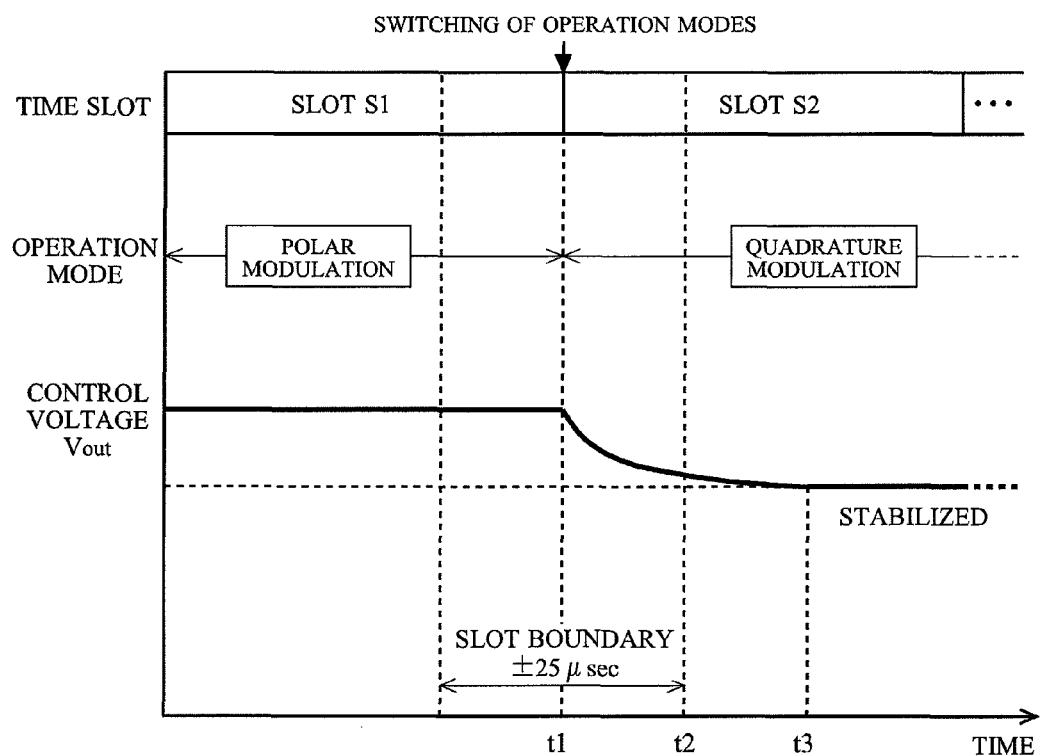
FIG. 10 is a diagram showing the state where the operation mode of the conventional transmission circuit 900 switches from a polar modulation mode to a quadrature modulation mode.

Here, in the conventional transmission circuit 900, although the power supply voltage is not stabilized at a desired value immediately after the time t1 when the operation mode has switched from the polar modulation mode to the quadrature modulation mode, the EM-IC 920 supplies the power supply voltage as it is as the control voltage Vout to the power amplifier 930. As shown in FIG. 10, in the conventional transmission circuit 900, power control does not stabilize in a slot boundary at the switching of slots.

On the other hand, in the transmission circuit 100 according to the first embodiment of the present invention, the LDO output selector switch 122 of the EM-IC 120 operates in the on-state during the control voltage adjustment period T: from the time t1 when the operation mode has switched from the polar modulation mode to the quadrature modulation mode; to the time t3 when the power supply voltage Vbuck stabilizes at a desired value. Consequently, the control voltage Vout supplied from the EM-IC 120 to the power amplifier 130 is the control voltage Vout generated on the basis of the input voltage Vamf via the LDO 121. That is, even immediately after the operation mode of the transmission circuit 100 according to the first embodiment of the present invention has switched from the polar modulation mode to the quadrature modulation mode, the EM-IC 120 supplies the control voltage Vout stabilized at the desired value to the power amplifier 130.

Next, at the time t3 when the power supply voltage Vbuck output from the DC-DC converter 123 stabilizes at the desired value, the LDO output selector switch 122 of the EM-IC 120 is switched to the off-state on the basis of the control of the RF-IC 110. The operation of the LDO output selector switch 122 in the off-state causes the EM-IC 120 to supply the power supply voltage Vbuck, output from the DC-DC converter 123, as it is as the control voltage Vout to the power amplifier 130.

As described above, based on the transmission circuit 100 according to the first embodiment of the present invention, when the operation mode of the transmission circuit 100 switches from the polar modulation mode to the quadrature modulation mode, it is possible to supply to the power amplifier 130 the control voltage Vout stabilized at a desired value in a slot boundary.

It should be noted that the control voltage adjustment period T: from the time t1 when the operation mode of the transmission circuit 100 according to the first embodiment of the present invention has switched from the polar modulation mode to the quadrature modulation mode; to the time t3 when the power supply voltage Vbuck stabilizes at the desired value, is a predetermined time set in advance in a storage section or the like. The RF-IC 110 switches the operation mode of the transmission circuit 100 according to the first embodiment of the present invention from the polar modulation mode to the quadrature modulation mode, and simultaneously controls the power supply voltage Vbuck, which is to be output from the DC-DC converter 123 of the EM-IC 120, such that the power supply voltage Vbuck is the power supply voltage for the quadrature modulation mode. Then, with reference to the control voltage adjustment period T set in advance in the storage section or the like, the RF-IC 110 controls the LDO output selector switch 122 of the EM-IC 120 to switch to the off-state after the elapse of the control voltage adjustment period T.

In addition, instead of setting the control voltage adjustment period T described above in advance in the storage section or the like, the transmission circuit 100 according to the first embodiment of the present invention may further include a monitoring section that monitors the power supply voltage Vbuck output from the DC-DC converter 123. After the operation mode of the transmission circuit 100 has switched from the polar modulation mode to the quadrature modulation mode, the monitoring section monitors that the power supply voltage Vbuck stabilizes at the desired value. The LDO output selector switch 122 of the EM-IC 120 is controlled to switch to the off-state at the time when the power supply voltage Vbuck has stabilized at the desired value. This makes it possible that even if a change in temperature occurs or individual variations occur in the DC-DC converter 123, the LDO output selector switch 122 is switched at the time when the power supply voltage Vbuck has stabilized at the desired value.

It should be noted that in the case where the power amplifier 130 of the transmission circuit 100 has a configuration in which a plurality of power amplifiers are connected together in a multistage manner, a plurality of EM-ICs 120 are also provided in accordance with the plurality of power amplifiers. In the case of this configuration, in the quadrature modulation mode, the power supply terminals of the plurality of power amplifiers connected together in a multistage manner are substantially connected together via the LDO output selector switches 122 of the respective EM-ICs 120. Such connections between the power supply terminals may cause the oscillations of the respective power amplifiers.

Figure 5:
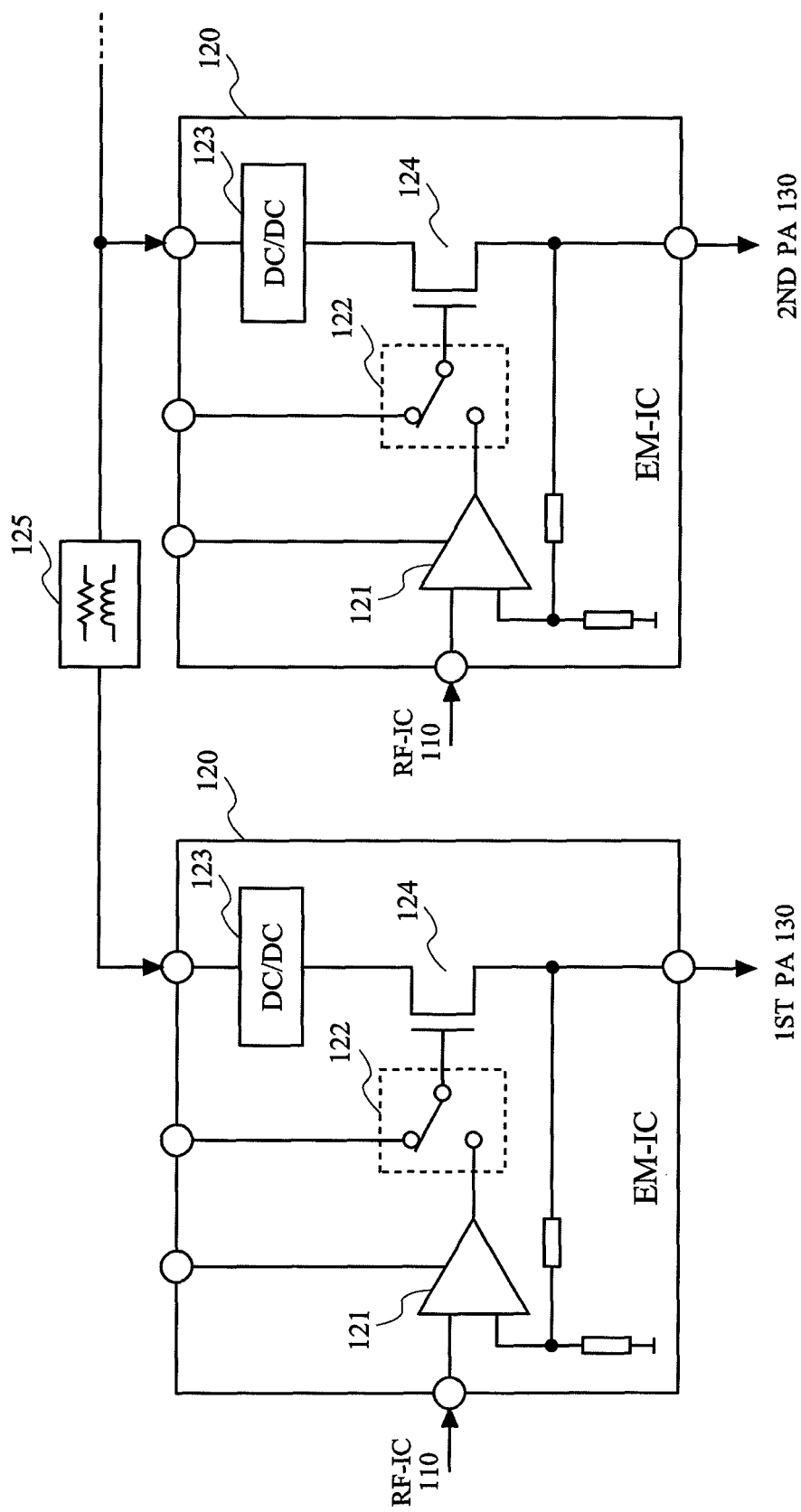
FIG. 5 is a diagram illustrating the state where, when a power amplifier 130 of the transmission circuit 100 is configured to have a multistage connection, isolation is ensured in the quadrature modulation mode.

In response, when the power amplifier 130 is configured to have a multistage connection, an isolator 125 such as an inductor or a resistor may be, as shown in FIG. 5, inserted into the power supply line between EM-ICs 120. The isolator 125 makes it possible to prevent the oscillations of the power amplifiers. It should be noted that FIG. 5 shows a configuration in which EM-ICs 120 are connected together in a two-stage manner. Alternatively, even when EM-ICs 120 are connected together in a three-or-more-stage manner, isolators 125 may be inserted in a similar manner.

<Second Embodiment>

Figure 6:
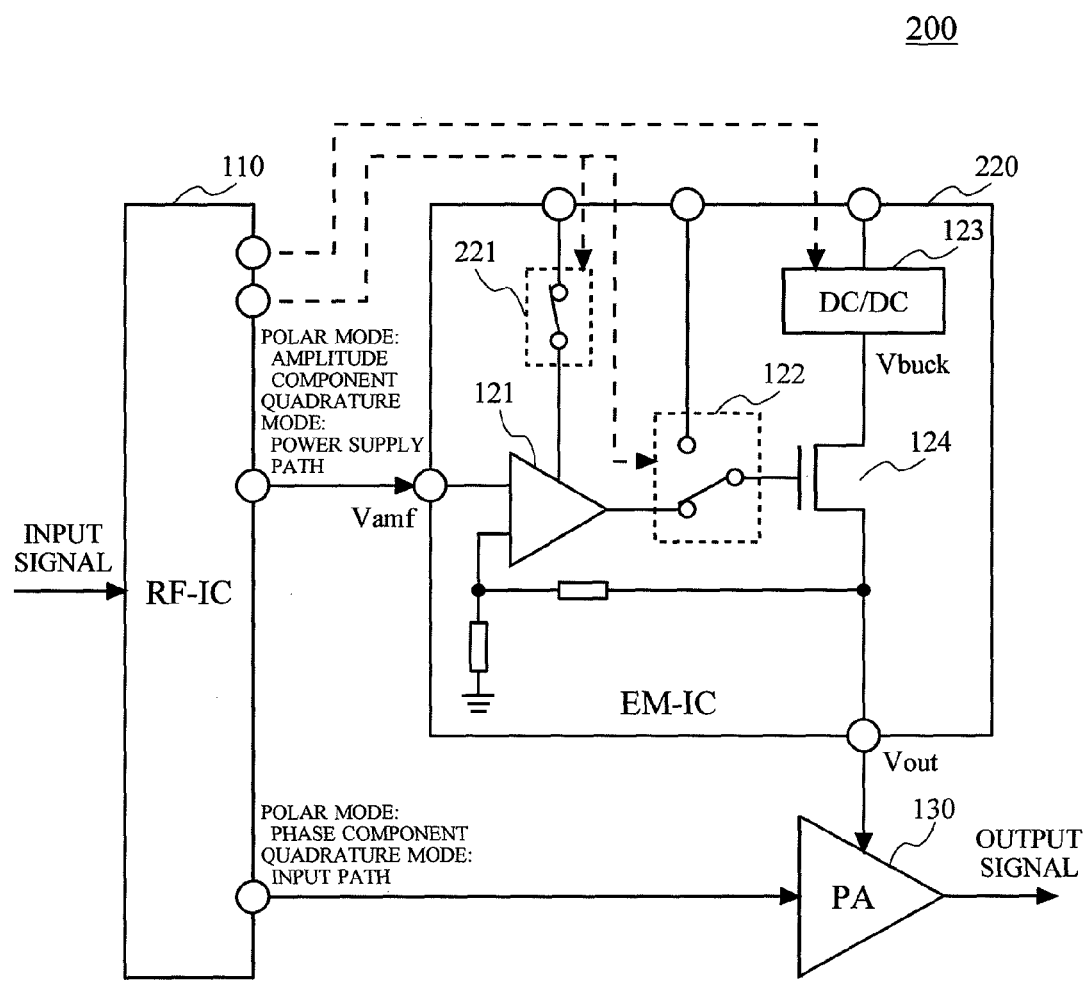
FIG. 6 is a diagram showing a transmission circuit 200 according to a second embodiment of the present invention.

FIG. 6 is a diagram showing a transmission circuit 200 according to a second embodiment of the present invention. In FIG. 6, the transmission circuit 200 according to the second embodiment of the present invention includes an RF-IC 110, an EM-IC 220, and a power amplifier (PA) 130. It should be noted that the EM-IC 220 includes an LDO 121, an LDO output selector switch 122, a DC-DC converter 123, a transistor 124, and an LDO power supply switch 221. In FIG. 6, the components of the transmission circuit 200 according to the second embodiment of the present invention that are the same as those of the transmission circuit 100 according to the first embodiment of the present invention shown in FIG. 1 are denoted by the same numerals, and therefore are not described here.

The transmission circuit 200 according to the second embodiment of the present invention is different from the transmission circuit 100 according to the first embodiment in that the EM-IC 220 includes the LDO power supply switch 221 at a power supply terminal of the LDO 121. In the second embodiment, the operation of the LDO power supply switch 221 is described in detail below.

Figure 7A:
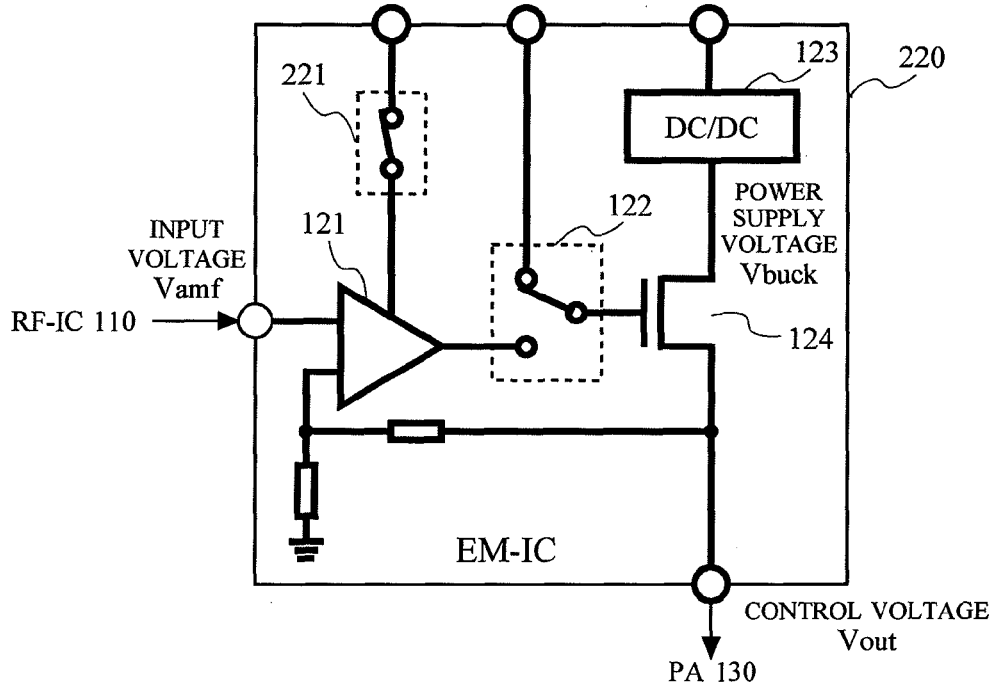
FIG. 7A is a diagram showing the state of an EM-IC 220 in the case where an LDO power supply switch 221 is in an on-state.

FIG. 7A is a diagram showing the state of the EM-IC 220 in the case where the LDO power supply switch 221 is in an on-state. Here, the LDO power supply switch 221 being in an on-state refers to the state where power is supplied to the power supply terminal of the LDO 121.

In FIG. 7A, the LDO power supply switch 221 is in the on-state, and therefore, power is supplied to the LDO 121 of the EM-IC 220; however, the LDO output selector switch 122 of the EM-IC 220 is in the off-state. As in the description, with reference to FIG. 2B, of the EM-IC 120 of the transmission circuit 100 according to the first embodiment of the present invention, the EM-IC 220 supplies the power supply voltage Vbuck, output from the DC-DC converter 123, as it is as the control voltage Vout to the power amplifier 130. In this case, the LDO 121 of the EM-IC 220 is driven by supplying power to the LDO 121.

Figure 7B:
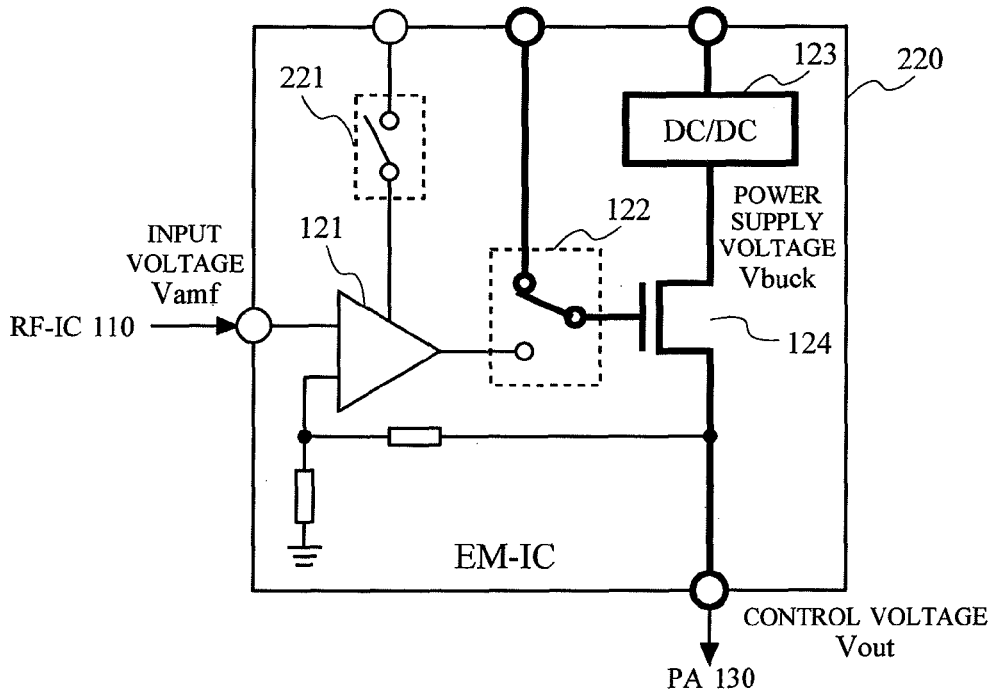
FIG. 7B is a diagram showing the state of the EM-IC 220 in the case where the LDO power supply switch 221 is in an off-state.

FIG. 7B is a diagram showing the state of the EM-IC 220 in the case where the LDO power supply switch 221 is in an off-state. Here, the LDO power supply switch 221 being in an off-state refers to the state where power is not supplied to the power supply terminal of the LDO 121.

In FIG. 7B, the LDO output selector switch 122 of the EM-IC 220 is in the off-state. Consequently, the EM-IC 220 supplies the power supply voltage Vbuck, output from the DC-DC converter 123, as it is as the control voltage Vout to the power amplifier 130. Accordingly, the LDO 121 of the EM-IC 220 does not need to be driven by supplying power to the LDO 121, and therefore, the LDO power supply switch 221 is in the off-state. In the EM-IC 220, the LDO 121 consumes a large amount of power. Thus, it is possible to reduce the power consumption of the entire transmission circuit 200 according to the second embodiment of the present invention by reducing the supply of power to the LDO 121.

Here, in FIGS. 3 and 4 described in the first embodiment of the present invention, the LDO output selector switch 122 is switched to the off-state at the time t3 after the elapse of the control voltage adjustment period T. In the case where the LDO output selector switch 122 is in the off-state, the LDO 121, as described with reference to FIG. 7B, does not need to be driven by supplying power to the LDO 121. That is, it is preferable to switch the LDO output selector switch 122 to the off-state, and simultaneously switch the LDO power supply switch 221 to the off-state.

As described above, based on the transmission circuit 200 according to the second embodiment of the present invention, when the operation mode of the transmission circuit 200 switches from the polar modulation mode to the quadrature modulation mode, it is possible to supply to the power amplifier 130 the control voltage Vout stabilized at a desired value in a slot boundary, and also possible to perform a low power consumption operation by reducing the supply of power to the LDO 121.

It should be noted that in the first and second embodiments of the present invention, the descriptions are given of the operation of the EM-IC in the case where the operation mode of the transmission circuit according to each embodiment switches from the polar modulation mode to the quadrature modulation mode. On the other hand, in the case where the operation mode of the transmission circuit according to each embodiment switches from the quadrature modulation mode to the polar modulation mode, the operation mode of the transmission circuit switches from the quadrature modulation mode to the polar modulation mode, and simultaneously, the EM-IC switches the LDO output selector switch from the off-state to the on-state, generates the control voltage Vout on the basis of the input voltage Vamf via the LDO, and supplies the control voltage Vout to the power amplifier.

<Third Embodiment>

Figure 8:
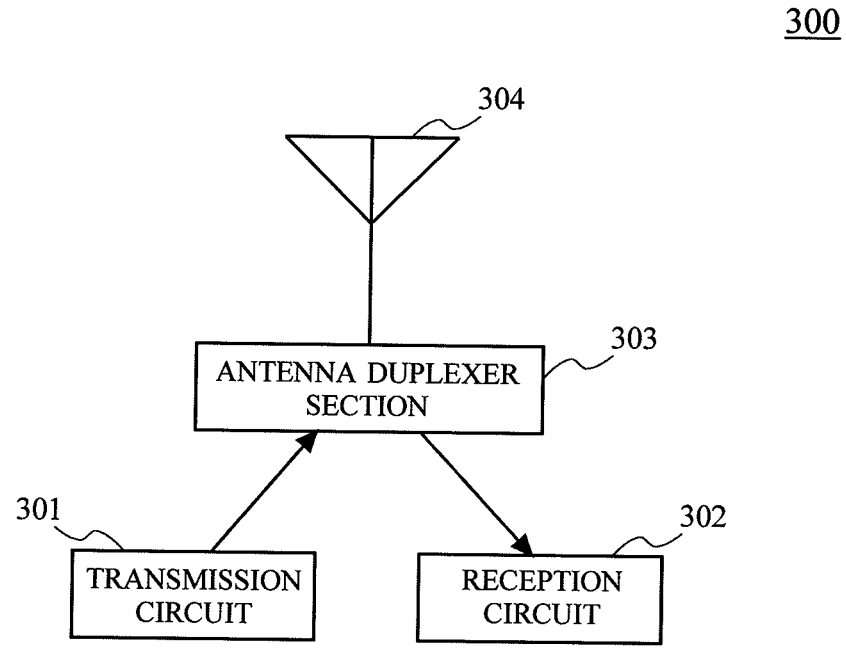
FIG. 8 is a diagram showing a communication apparatus 300 according to a third embodiment of the present invention.
Figure 9:
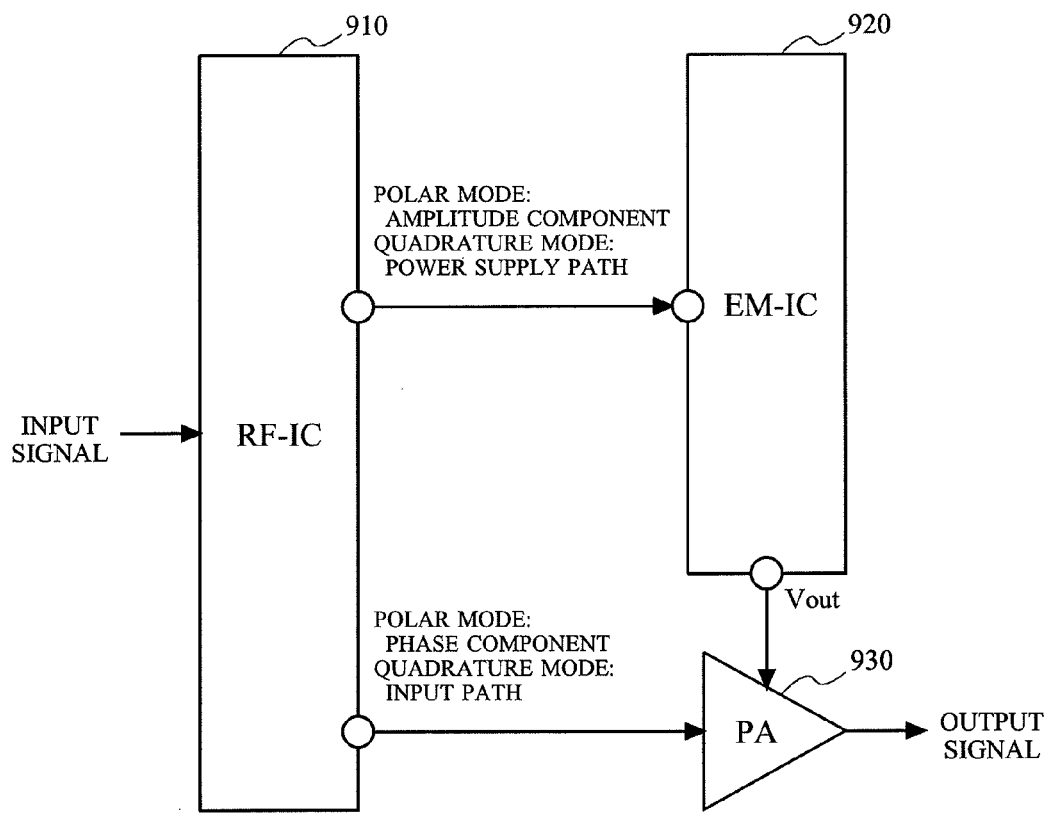
FIG. 9 is a diagram showing a conventional transmission circuit 900.

FIG. 8 is a diagram showing a communication apparatus 300 according to a third embodiment of the present invention. In FIG. 8, the communication apparatus 300 includes a transmission circuit 301, a reception circuit 302, an antenna duplexer section 303, and an antenna 304. To the transmission circuit 301, either one of the transmission circuits 100 and 200 according to the first and second embodiments of the present invention described above is applied.

The antenna duplexer section 303 conveys to the antenna 304 a transmission signal output from the transmission circuit 301, and thereby prevents the transmission signal from leaking to the reception circuit 302. Further, the antenna duplexer section 303 conveys to the reception circuit 302 a reception signal input from the antenna 304, and thereby prevents the reception signal from leaking to the transmission circuit 301. The transmission signal is output from the transmission circuit 301, and is emitted to space from the antenna 304 via the antenna duplexer section 303. The reception signal is received by the antenna 304, and is received by the reception circuit 302 via the antenna duplexer section 303.

Here, to the transmission circuit 301, either one of the transmission circuits 100 and 200 according to the first and second embodiments of the present invention is applied. Thus, it is needless to say that the transmission circuit 301 produces effects similar to those described in the first and second embodiments of the present invention.

As described above, based on the communication apparatus 300 according to the third embodiment, when the operation mode of the transmission circuit 301 switches from the polar modulation mode to the quadrature modulation mode, it is possible to supply to the power amplifier the control voltage Vout having a desired amplitude level stabilized in a slot boundary.

In addition, the output of the transmission circuit 301 does not have a branch such as a directional coupler. This makes it possible to reduce the loss from the transmission circuit 301 to the antenna 304, and therefore reduce the power consumption at the time of transmission. This enables the long-term use of the transmission circuit 301 as a wireless communication apparatus. It should be noted that the communication apparatus 300 may include only the transmission circuit 301 and the antenna 304.

Industrial Applicability

The present invention can be used for a communication apparatus such as a mobile phone or a wireless LAN, and the like, and in particular, is useful in, for example, achieving a low-distortion and high-efficiency operation.

DESCRIPTION OF THE REFERENCE CHARACTERS 100, 200, 900 transmission circuit
110, 910 radio frequency integrated circuit (RF-IC)
120, 220, 920 envelope management integrated circuit (EM-IC)
121 low-dropout regulator (LDO)
122 LDO output selector switch
123 DC-DC converter
124 transistor
125 isolator
130, 930 power amplifier (PA)
221 LDO power supply switch
300 communication apparatus
301 transmission circuit
302 reception circuit
303 antenna duplexer section
304 antenna
S1, S2 slot
t1-t3 time
T control voltage adjustment period
Vamf, Vbuck, Vout, v1-v3, v1', v2' voltage

The invention claimed is:

1. A transmission circuit that amplifies a power of an input transmission signal by switching an operation mode of the transmission circuit between a polar modulation mode and a quadrature modulation mode, the transmission circuit comprising:

a radio frequency integrated circuit that controls the operation mode of the transmission circuit on the basis of the input transmission signal, generates an amplitude-modulated signal and a phase-modulated signal in the polar modulation mode, and generates a quadrature-modulated signal in the quadrature modulation mode;

an envelope management integrated circuit that generates a control voltage on the basis of the amplitude-modulated signal from the radio frequency integrated circuit or a power supply voltage; and a power amplifier that amplifies a power of the phase-modulated signal or the quadrature-modulated signal from the radio frequency integrated circuit on the basis of the control voltage from the envelope management integrated circuit, the envelope management integrated circuit including:

a DC-DC converter that outputs the power supply voltage for the polar modulation mode or the quadrature modulation mode on the basis of the control of the operation mode by the radio frequency integrated circuit;

a transistor whose source is connected to an output of the DC-DC converter and whose drain is connected to a power supply terminal of the power amplifier;

a regulator having an input terminal to which the amplitude-modulated signal from the radio frequency integrated circuit is input, and a common terminal which is connected to the drain of the transistor and to which the power supply voltage for the polar modulation mode or the quadrature modulation mode from the DC-DC converter is input; and a regulator output selector switch that, on the basis of the control of the operation mode by the radio frequency integrated circuit, connects a gate of the transistor to an output terminal of the regulator while the operation mode of the transmission circuit is the polar modulation mode, and, when the operation mode of the transmission circuit has switched from the polar modulation mode to the quadrature modulation mode, switches a connection destination of the gate of the transistor to a fixed potential after an elapse of a predetermined time until the power supply voltage for the quadrature modulation mode output from the DC-DC converter stabilizes at a desired value.

2. The transmission circuit according to claim 1, wherein the predetermined time is set in advance.

3. The transmission circuit according to claim 1, further comprising
a monitoring section that monitors the power supply voltage for the quadrature modulation mode output from the DC-DC converter, wherein
the regulator output selector switch switches the connection destination of the gate of the transistor to the fixed potential at a time when the power supply voltage for the quadrature modulation mode, which has been monitored by the monitoring section since the operation mode of the transmission circuit has switched from the polar modulation mode to the quadrature modulation mode, stabilizes at the desired value.

4. The transmission circuit according to claim 1, wherein the regulator output selector switch switches the connection destination of the gate of the transistor to the output terminal of the regulator simultaneously when the operation mode of the transmission circuit switches from the quadrature modulation mode to the polar modulation mode.

5. The transmission circuit according to claim 1, wherein supply of power to the regulator is stopped simultaneously when the connection destination of the gate of the transistor is switched to the fixed potential.

6. A communication apparatus comprising:
a transmission circuit that generates a transmission signal; and
an antenna that outputs the transmission signal generated by the transmission circuit, wherein
the transmission circuit is the transmission circuit according to claim 1.

7. The communication apparatus according to claim 6, further comprising:
a reception circuit that processes a reception signal received from the antenna; and
an antenna duplexer that outputs to the antenna the transmission signal generated by the transmission circuit, and outputs to the reception circuit the reception signal received from the antenna.

8. A method of amplifying a power of an input transmission signal by switching an operation mode of a transmission circuit between a polar modulation mode and a quadrature modulation mode, the method comprising:
a signal generation step of controlling the operation mode of the transmission circuit on the basis of the input transmission signal, generating an amplitude-modulated signal and a phase-modulated signal in the polar modulation mode, and generating a quadrature-modulated signal in the quadrature modulation mode;
a control voltage generation step of generating a control voltage on the basis of the amplitude-modulated signal generated in the signal generation step or a power supply voltage; and
a power amplification step of, on the basis of the control voltage generated in the control voltage generation step, amplifying a power of the phase-modulated signal or the quadrature-modulated signal generated in the signal generation step,
the control voltage generation step including:
a step of, immediately after the operation mode of the transmission circuit has switched from the polar modulation mode to the quadrature modulation mode, feeding back the power supply voltage for the quadrature modulation mode, output from a DC-DC converter, to a common terminal of a regulator while maintaining a connection destination of a gate of a transistor at an output terminal of the regulator, and outputting the control voltage based on the amplitude-modulated signal input to an input terminal of the regulator; and
a step of, after an elapse of a predetermined time from a time when the operation mode of the transmission circuit has switched from the polar modulation mode to the quadrature modulation mode to a time when the power supply voltage for the quadrature modulation mode output from the DC-DC converter stabilizes at a desired value, switching the connection destination of the gate of the transistor to a fixed potential, and outputting as the control voltage the power supply voltage for the quadrature modulation mode output from the DC-DC converter.

\* \* \* \* \*